US012601049B2

(12) United States Patent
Lindic et al.

(10) Patent No.: US 12,601,049 B2
(45) Date of Patent: Apr. 14, 2026

(54) Ag- AND/OR Cu-CONTAINING HARD COATINGS WITH ANTIBACTERIAL, ANTIVIRAL AND ANTIFUNGAL PROPERTIES

(71) Applicant: Oerlikon Surface Solutions AG, Pfäffikon, Pfäffikon (CH)

(72) Inventors: Marie-Hélène Lindic, Geneva (CH); Noora Manninen, Chur (CH); Canet Acikgoz Dorokin, Zürich (CH); Martin Drabik, Sargans (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 61 days.

(21) Appl. No.: 18/255,523

(22) PCT Filed: Dec. 2, 2021

(86) PCT No.: PCT/EP2021/083911
§ 371 (c)(1),
(2) Date: Jun. 1, 2023

(87) PCT Pub. No.: WO2022/117704
PCT Pub. Date: Jun. 9, 2022

(65) Prior Publication Data
US 2024/0003001 A1      Jan. 4, 2024

(30) Foreign Application Priority Data
Dec. 2, 2020      (DE) ......................... 102020007351.4

(51) Int. Cl.
C23C 16/06      (2006.01)
C23C 16/455      (2006.01)
C23C 16/56      (2006.01)

(52) U.S. Cl.
CPC ........ *C23C 16/06* (2013.01); *C23C 16/45529* (2013.01); *C23C 16/56* (2013.01)

(58) Field of Classification Search
CPC ... C23C 16/06; C23C 16/45529; C23C 16/56; H01L 21/0251; A61L 2300/104
See application file for complete search history.

(56) References Cited

U.S. PATENT DOCUMENTS 10,143,196 B2      12/2018      Colmenares Mora et al.
2013/0224274 A1*      8/2013      Colmenares Mora .. A61L 29/08
204/192.12

FOREIGN PATENT DOCUMENTS

CN          1570196          *      1/2005
CN          1570196 A          1/2005
(Continued)

OTHER PUBLICATIONS

JP 5148037 machine translation (Year: 2013).*
International Search Report for PCT Application No. PCT/EP2021/083911, mailed Sep. 1, 2022; 10 pages.

*Primary Examiner* — Tabassom Tadayyon Eslami

(57)          ABSTRACT

A substrate with a surface wherein the surface at least comprises an area which is coated with a coating having antibacterial and/or antiviral and/or antifungal properties. The coating includes an optional first layer, a second layer, and preferably a third layer, wherein the second layer is a hard layer comprising Ag and/or Cu, the optional first layer is located between the substrate body and the second layer, and the third layer is a top layer forming the outer surface of the area and which is tailored to allow Ag and/or Cu ions to leave the surface in a predetermined manner.

9 Claims, 3 Drawing Sheets

(56)　　　　　　　References Cited

FOREIGN PATENT DOCUMENTS

| | | | |
|---|---|---|---|
| CN | 103052410 | A | 4/2013 |
| CN | 104471101 | A | 3/2015 |
| CN | 106890367 | * | 6/2017 |
| CN | 107190234 | * | 9/2017 |
| JP | 2017196878 | A | 11/2017 |
| KR | 20140136037 | A | 11/2014 |

* cited by examiner

Ag- AND/OR Cu-CONTAINING HARD COATINGS WITH ANTIBACTERIAL, ANTIVIRAL AND ANTIFUNGAL PROPERTIES

TECHNICAL FIELD

The present invention relates to a hard coating comprising Ag (Silver) and/or Cu (Copper) in metallic form, being the soft metal distributed in the hard coating in the form of nanoparticles, islands or layers within the hard coating. When immersed in water based liquids (e.g. body fluids) or when in contact with air humidity, the Ag- and/or Cu-containing hard coating releases Ag in ionic form ($Ag^+$) and/or Cu in ionic form ($Cu^+$) and of a method for producing a coating. The silver ions and copper ions are known for their antibacterial, antiviral and antifungal activity. Furthermore, the present invention relates to a method of producing the Ag- and/or Cu-containing hard coatings, that show antibacterial activity and potential antiviral and antifungal activity.

FIELD AND BACKGROUND OF THE INVENTION

It is well known that Ag- and/or Cu-containing hard coatings produced by physical vapor deposition (PVD) techniques exhibit antibacterial activity; furthermore the addition of soft metals to hard coatings can enhance the tribological properties due to reduction of friction coefficient promoted by presence of soft metals. Metallic coatings containing Ag coupled with Au (gold) or Pt (platinum) layers are commercially available; however, those exhibit poor mechanical and tribological wear resistance. Conversely, the combination of Ag with hard coatings allows to put together high wear resistance with antibacterial activity. Furthermore, due to their chemical inertness, hard coatings typically have a protective effect preventing substrate from corrosion. It is also known that the amount of Ag to be incorporated in the coating is preferably within a range of about 2 at. % to 15 at. %, as described by Colmenares Mora et al in U.S. Pat. No. 10,143,196B2, in order to obtain acceptable coating adhesion, coating hardness and coating roughness values. In addition the incorporation of Ag above 15 at. % results in a change in coating color, which in some applications (e.g. surgical instruments and decorative coatings) is not a desired effect.

There are however at least two factors which influence the antibacterial, antiviral and antifungal activity, in particular the efficiency, of the released ions.

i) depending on the humidity of the environment, more or less ions are released into the environment.

ii) depending on the kind of species to be acted against, higher or lower concentration of ions might be needed.

The antibacterial, antiviral and antifungal activity can depend on the type of virus, bacteria, fungi and application. In a dental implant, more ions can be needed than in a knee implant, as one example. The bacteria can grow at different speeds in different applications. Each bacteria can have its own rate of growth. This is just a general informative comment but should not restrict this invention in any case.

There is therefore a need to provide control means for the release of Ag- and/or Cu ions from the hard coating.

OBJECT OF THE INVENTION

The objective of the present invention is to provide a substrate with a coating with antibacterial, antiviral and antifungal activity, wherein the coating comprises a Ag- and/or Cu-containing hard coating, and preferably wherein the applied coating is tailored to allow Ag and/or Cu ions to leave the surface of the coating in a predetermined manner.

Another objective of the present invention is to provide a method involving PVD techniques for producing Ag- and/or Cu-containing hard coatings with antibacterial, antiviral and antifungal activity, wherein the applied coating promotes a controlled release of metal ions (Cu+ and Ag+).

Surfaces that are able to kill bacteria or inactivate viruses are of major relevance due to the high and fast spread of the bacteria and viruses worldwide. In addition, the destruction of bacteria has become harder over time, due to enhanced antibiotic resistance. The coating described in the invention can be used in any medical application (e.g. surgical instruments or medical implants, such as dental implants and articulating implants, or the like), on any industrial application, preferably where during use an interaction with humans might occur (e.g. components of aircraft cabin interior or car interior, or the like) and also on any functional surface prone to bacterial, viral and fungal contamination (e.g. machines used in food processing industries, pens and pencils, door handles, elevator buttons, or the like). Preferably, the coating can also have a decorative function, which is given by the chemical composition of the top layer coating.

SUMMARY OF THE INVENTION

The objective of the present invention is to provide a coating method for producing Ag- and/or Cu-containing hard coatings, which allow the release of Cu and/or Ag in ionic form from the hard coating, preferably during use. Ag and/or Cu ions have been proven to have antibacterial, antiviral and antifungal activity. Therefore, the incorporation of these metals in hard coatings allows the coatings to obtain antibacterial, antiviral and antifungal surfaces, with high wear resistance and corrosion protection of the substrate material. Hereby the high wear resistance preferably comes from the hard coating, while the antibacterial, antiviral and/or antifungal operating principle preferably comes from the Ag and/or Cu ions.

The coating used in the description is preferably coated on a substrate 2 and preferably comprises three major layers:

a first layer is a bonding layer 1, a second layer is a hard coating layer 3 with Ag and/or Cu and a third layer is a top layer 4. The bonding layer 1 is coated between the substrate 2 and the hard coating layer 3. This is schematically shown in FIG. 1a. The top layer 4 is a layer, being its main function, according to the invention, to control the Ag ion release. As a side effect, the top layer 4 can as well provide a desired color to the coating.

In a further embodiment of the invention, the coating used in the description is preferably coated on the substrate 2 and preferably comprises two major layers: the first layer is the bonding layer 1, the second layer is the hard coating layer 3 with Ag and/or Cu. In this embodiment, the coating does not comprise the top layer 4. The bonding layer 1 is coated between the substrate 2 and the hard coating layer 3. This is schematically shown FIG. 1b that shows schematically the layout of an example without the top layer 4.

The bonding layer 1 and the top layer 4 can comprise any of the following metals (Ti, Zr, Nb, Cr, Al, Si, Ta, V) independently or combined as alloys, preferably either in metallic form or preferably containing nitrogen, carbon, hydrogen and/or oxygen. The hard coating layer 3, in addition to the Ag and/or Cu can be preferably composed of (Ti, Zr, Nb, Cr, Al, Si, Ta, V) independently or combined as alloys, preferably either in metallic form or preferably containing nitrogen, carbon, hydrogen and/or oxygen. It can be preferable that the bonding layer 1, the top layer 4 and/or the hard coating layer 3 have a different composition. In another embodiment, it can be preferable that the bonding layer 1, the top layer 4 and/or the hard coating layer 3 have the same composition.

The growth of Ag and/or Cu in the hard coating layer 3 can be tailored, preferably during producing the Ag- and/or Cu-containing hard coating, in particular during PVD coating grow:

(i) in order to allow formation of continuous Ag and/or Cu layers, and/or (ii) in order to allow the formation of Ag and/or Cu islands and/or (iii) in order to allow formation of Ag and/or Cu particles.

In the context of this application islands preferably means non fully coalesced layers. It is open to the person skilled in the art that islands can have a further meaning.

The thickness of the layers and islands, as well as the dimension of the particles can range from one nanometer up to several micrometers. Several micrometers are for example about 0.1 micrometer up to about 500 micrometers, preferably about 0.5 micrometer up to about 50 micrometers, preferably about 1 micrometer up to about 10 micrometers.

As the inventors found, the top layer 4 and its layout can be used to control the release of the ions. According to a first embodiment of the present invention, any thickness of the top layer 4 between 0 nm and 100 nm will change such release.

According to a second embodiment of the present invention, the top layer 4 can be structured in order to facilitate the release of the ions. For example if the top layer 4 is a layer deposited by arc deposition, one effect which typically is seen as a problem is the formation of so called droplets within the layer. If the top layer 4 is a layer from reactive deposition, these droplets can be seen as conglomerates of metallic particles which in its core in most cases are still metallic but which have reacted in their periphery. Washing out these droplets from the top coating 4 results in holes in the coating which allows the ion-release to be facilitated. In effect, one skilled in the art knows different approaches to change the permeability of the top layer 4 and adjust it to specific needs.

It should be mentioned that in a further embodiment of the invention it is not necessary to have the layers strictly defined by interfaces. Continuous transitions for example in the form of gradients are possible as well. It is however preferable to have no Ag and/or Cu present in the first layer 1 as a release of ions could potentially have a negative effect on the coating adhesion. In cases where this is not an issue and adhesion is not an issue the first layer 1 according to the invention is optional. Having a first layer 1 as described above describes therefore a preferred embodiment.

It is as well preferable to have less Ag and/or Cu concentration present in the top layer 4 as this will potentially lead to a longer lifetime of the coating with antibacterial effect. The amount of Ag and/or Cu concentration present in the top layer 4 can vary for example: for different families of bacteria, for different families of virus and for different families of fungi, where preferably different ranges of ions are needed.

BRIEF DESCRIPTION OF THE DRAWINGS

The invention is now described in more detail on the basis of example and with the help of the figures.

DETAILED DESCRIPTION OF THE INVENTION

Figure 1A:
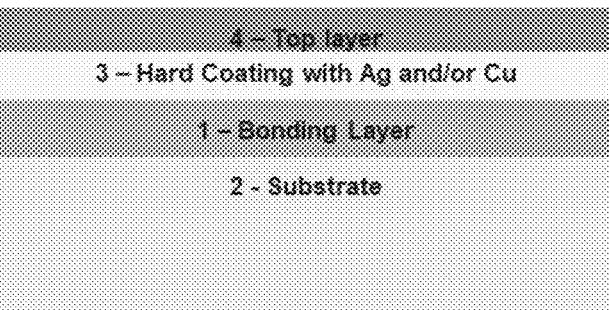
FIG. 1a gives a schematic representation of the coating described in the present invention with a top layer 4.
Figure 1B:
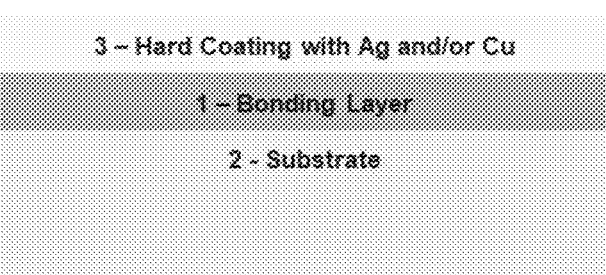
FIG. 1b shows the coating of FIG. 1a without the top layer 4.
Figure 2:
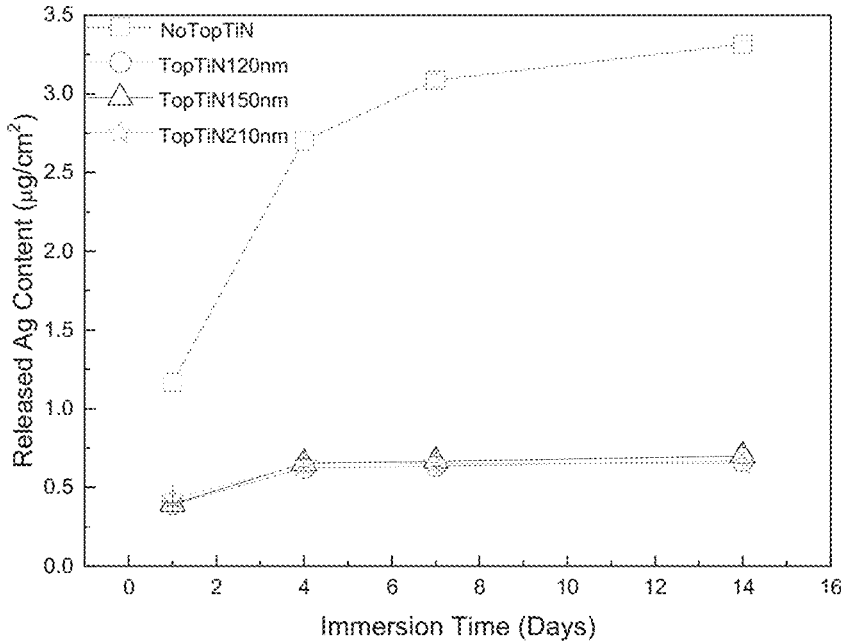
FIG. 2 shows the measured Ag ion release as a function of immersion time, measured by ICP-OES (inductively coupled plasma optical emission spectrometry) over 14 days. Results are shown for TiN—Ag coating without top layer 4 and for TiN—Ag with top TiN layer 4 with different thicknesses ranging from 120 nm to 210 nm.
Figure 3:
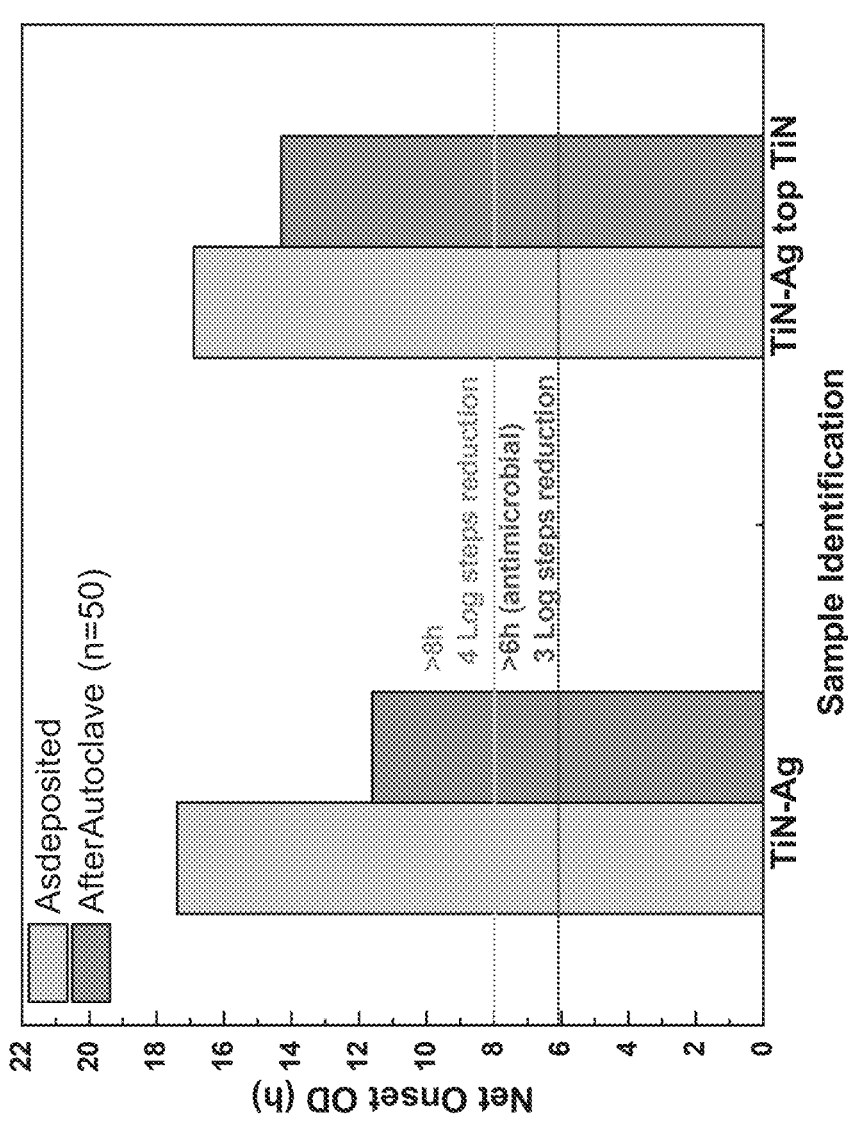
FIG. 3 shows antibacterial test results (Certika proliferation assay from Quality Labs, Germany) tested in AgTiN coating variants without top layer (TiN—Ag) 4 and with top TiN layer (TiN—Ag top TiN) 4 after 50 autoclave cycles and as-deposited (one autoclave cycle).

The release of Ag ions in AgTiN coating (as an example of the TiN hard coating 3 containing Ag) has been evaluated by Inductively Coupled Plasma-Optical Emission Spectroscopy (ICP-OES). The tested coatings had a bonding layer 1 composed of TiN, a hard coating layer 3 with Ag composed of AgTiN with about 3 at. % of Ag, and a top layer 4 composed of TiN. The measured results are shown in FIG. 2. The coatings were immersed in DMEM (Dulbecco's Modified Eagle Medium) with 10% FCS (fetal calf serum), being the area/fluid ratio 3 cm$^2$/ml. The fluid samples were removed and measured in ICP-OES after 1 day, 4 days, 7 days and 14 days of immersion.

The Ag ion release measurements indicate that the TiN—Ag based coatings release Ag ions (Ag$^+$), being the amount of ions dependent on the presence of top layer 4. For a coating with no top layer 4 the coating releases a higher amount of Ag ions along time in comparison with coatings with top layer 4. The Ag$^+$ release is similar with top layers 4 with thickness in a range of 100 nm to 200 nm, as FIG. 2 shows. The Ag ion release is faster in the first 24 h and after 4 days it stabilizes, as could be seen preferably in all coatings, preferably with and without top layer 4 and preferably with different sizes of the top layer 4. Therefore and according to the present invention the top layer 4 can be used to control the ion release on the surface.

The amount of Ag released from the coating is extremely low in comparison to the total amount of Ag existing in the coating and therefore in chemical composition analysis (EDS (energy dispersive spectroscopy) and RBS (Rutherford back-scattering spectrometry)) before and after ion release tests no variations in amount of Ag, preferably meaning no considerable variations in amount of Ag, are detected.

The antibacterial activity of the coatings was tested in a Certika Proliferation test assay, performed at Quality Labs in Germany. The coating was tested with Staphylococcus epidermidis DSM18857 (Initial inoculum: 5×10$^6$ cell count/ml). The coating was tested after one sterilization cycle in autoclave and after 50 autoclave cycles, for both variants without top layer (TiN—Ag) 4 and with top TiN layer (TiN—Ag-top TiN) 4. All coating variants are antibacterial with more than >8 h net onset optical density (OD) (indicating a 4 log step reduction of bacterial growth in relation to reference sample), even after 50 autoclave cycles. No cytotoxicity was detected in test following ISO-10933-5, tested with both 3T3 cells and human dermal fibroblasts.

The release of Ag ions has a proved antibacterial effect, without any cytotoxic effect. The release of Ag ions has also been associated with the antiviral effect against different viruses. The antibacterial, antiviral and antifungal activity of Ag- and/or Cu-containing coatings is provided by the release of Ag and/or Cu ions, respectively.

The release of Ag and/or Cu ions is an electrochemical process, which involves presence of four elements: (i) cathode, (ii) anode; (iii) electrolyte and (iv) electrical contact between cathode and anode. The anode is the Ag and/or Cu, in layer/islands/nanoparticles form, while the cathode is the hard coating 3, being both in electrical contact, given that the Ag and/or Cu islands/layers/particles are embedded in the hard coating material. The electrolyte can be any of the body fluids in contact with the coating surface (e.g. sweat, synovial fluid, saliva, or the like); humidity from air or water or the like. The Ag- and/or Cu-containing hard coatings 3 can provide a source of Cu and/or Ag ions release provided that the hard coating 3 has the capacity to act as cathode (electron acceptor).

The coating described herein can be applied on any surface, preferably of a substrate 2, and it is mostly relevant for surfaces where contamination with bacteria, virus and fungi can represent a threat to human health (e.g. medical implants, surgical instruments, food processing machines and tools or the like) and/or also surfaces which are directly exposed to continuous human contact (e.g. elevator buttons, pens/pencil, door handles, cabin and car interior components or the like).

In contrast to what was described above, in a further embodiment of the invention, the top layer 4 can also be formed in such a way, that ions are leaving more easily the substrate 2 as they would do without top layer 4. One could say that the top layer 4 is activating the silver ion diffusion. This can be important in circumstances where the antibacterial or antiviral effect of the surface needs to be effective in a fast manner.

Therefore, according to another embodiment of the present invention the top layer 4 can be a layer formed by or can comprise so called activating carrier systems. Such carrier systems can be formed with the help of vesicles and/or miscelles. The application of components that form the carrier system on the substrate for example can be carried out by immersion, spraying, coating or splashing, followed by a thermal process in the course of which the continuous phase (e.g. water) that prevails during the application is evaporated.

A substrate 2 was described with a surface wherein the surface at least comprises an area which is coated with a coating with antibacterial and/or antiviral and/or antifungal properties, characterized in that the coating comprises an optional first layer, a second layer and preferably a third layer, wherein the second layer is a hard layer 3 comprising Ag and/or Cu, wherein the optional first layer is located between the substrate 2, i.e. the substrate body, i.e. the surface of the substrate 2, and the second layer, and wherein the preferably third layer is a top layer 4 forming the outer surface of the coating and which is tailored to allow Ag and/or Cu ions to leave the surface of the coating in a predetermined manner.

The optional first and the second layer can be PVD and/or CVD layers.

CVD is not limited to but may be for example PECVD.

The top layer can be a PVD and/or CVD layer preferably with a layer thickness between about 10 nm and about 400 nm.

It is possible that the optional first, the second, and the preferable third layer do not have strict interfaces to each other but are realized as gradient layers.

The top layer 4 can comprise a carrier system for activating the release of ions.

Protection is sought for a substrate with a surface wherein the surface at least comprises an area which is coated with a coating with antibacterial and/or antiviral and/or antifungal properties, characterized in that the coating comprises an optional first layer, a second layer and a third layer, wherein the second layer is a hard layer comprising Ag and/or Cu, wherein the optional first layer is located between the substrate body and the second layer, and wherein the third layer is a top layer forming the outer surface of the area and which is tailored to allow Ag and/or Cu ions to leave the surface in a predetermined manner.

Preferably with area it is meant one part of the surface. In a further embodiment the area can be the whole surface. Preferably the area is only one part of the surface, in particular between about 1% and about 99%, preferably between about 5% and about 90%, more preferably between about 10% and about 70% of the surface.

Protection is sought for a substrate according to one or more of the previous paragraphs, characterized in that the optional first and the second layers are PVD and/or CVD layers.

Protection is sought for a substrate according to one or more of the previous paragraphs, characterized in that the top layer is a PVD and/or CVD layer with a layer thickness between 10 nm and 400 nm.

Protection is sought for a substrate according to one or more of the previous paragraphs, characterized in that the optional first, the second, and the third layer do not have strict interfaces to each other but are realized as gradient layers.

Protection is sought for a substrate according to one or more of the previous paragraphs, characterized in that the top layer comprises a carrier system for activating the release of ions.

The invention claimed is:

1. A substrate comprising:

a surface having an area which is coated with a coating with antibacterial and/or antiviral and/or antifungal properties, wherein the coating comprises an optional first layer, a second layer and a third layer, wherein the second layer is a hard layer composed of Ti, Zr, Nb, Cr, Al, Si, Ta or V independently or combined as alloys in metallic form or containing nitrogen, carbon, hydrogen and/or oxygen, and comprising Ag and/or Cu in metallic form, wherein the optional first layer is located between the surface of the substrate and the second layer, wherein the third layer is a top layer forming an outer surface of the coating and having a layer thickness between about 10 nm and about 400 nm and the top layer consists of TiN, and wherein the top layer is formed with droplets that are washed out of the top layer resulting in holes in the top layer, and the holes allow an ion-release to be facilitated.

2. The substrate according to claim 1, wherein the optional first and the second layers are PVD and/or CVD layers.

3. The substrate according to claim 1, wherein the top layer is a PVD and/or CVD layer.

4. The substrate according to claim 1, wherein the top layer comprises a carrier system for activating a release of ions.

5. The substrate according to claim 1, wherein the top layer is tailored to allow Ag and/or Cu ions to leave the surface of the coating in a predetermined manner.

6. The substrate according to claim 1, wherein the optional first, the second and the third layer are realized as gradient layers.

7. The substrate according to claim 6, wherein the optional first layer, the second layer and the third layer have no strict interfaces with each other.

8. A method for producing Ag- and/or Cu-containing hard coatings on a substrate, comprising:

coating an area of a surface of the substrate with a coating having antibacterial and/or antiviral and/or antifungal properties, wherein the coating comprises an optional first layer, a second layer and a third layer, wherein in an optional first method step, the optional first layer is coated using PVD and/or CVD, coated on the surface of the substrate, wherein in a second method step, the second layer is coated using PVD and/or CVD, coated on the optional first layer or on the surface of the substrate, wherein in a third method step, the third layer is coated on the second layer using PVD and/or CVD, and in the third method step, arc deposition is used, forming droplets within the third layer, wherein the second layer is a hard layer composed of Ti, Zr, Nb, Cr, Al, Si, Ta or V independently or combined as alloys in metallic form or containing nitrogen, carbon, hydrogen and/or oxygen, and comprising Ag and/or Cu in metallic form, wherein the third layer is a top layer forming an outer surface of the coating and having a layer thickness between about 10 nm and about 400 nm and the top layer consists of TiN, and wherein the droplets are washed out of the top layer resulting in holes in the top layer, and the holes allow an ion-release to be facilitated.

9. The method according to claim 8, wherein the top layer is tailored to allow Ag and/or Cu ions to leave the surface of the coating in a predetermined manner.

* * * * *